US008062548B2

(12) United States Patent
Ohta et al.

(10) Patent No.: US 8,062,548 B2
(45) Date of Patent: Nov. 22, 2011

(54) POLISHING SLURRY

(75) Inventors: Yoshiharu Ohta, Yamatokoriyama (JP); Rika Tanaka, Yamatokoriyama (JP); Hiroshi Nitta, Yamatokoriyama (JP); Yoshitaka Morioka, Yamatokoriyama (JP)

(73) Assignee: Nitta Haas Incorporated, Osaka (JP)

( * ) Notice: Subject to any disclaimer, the term of this patent is extended or adjusted under 35 U.S.C. 154(b) by 1015 days.

(21) Appl. No.: 11/794,626

(22) PCT Filed: Jan. 5, 2006

(86) PCT No.: PCT/JP2006/300036
§ 371 (c)(1),
(2), (4) Date: Jul. 3, 2007

(87) PCT Pub. No.: WO2006/073156
PCT Pub. Date: Jul. 13, 2006

(65) Prior Publication Data
US 2009/0278080 A1    Nov. 12, 2009

(30) Foreign Application Priority Data
Jan. 5, 2005    (JP) ................................. 2005-000846

(51) Int. Cl.
*C09K 13/00*    (2006.01)

(52) U.S. Cl. ..................... 252/79.1; 252/79.2; 252/79.3; 252/79.4; 438/689; 438/692; 438/702

(58) Field of Classification Search ........ 252/79.1–79.4; 438/689, 692, 702
See application file for complete search history.

(56) References Cited

U.S. PATENT DOCUMENTS

| | | | |
|---|---|---|---|
| 5,693,239 A | 12/1997 | Wang et al. | |
| 5,759,917 A * | 6/1998 | Grover et al. | 438/690 |
| 6,340,374 B1 | 1/2002 | Kato et al. | |
| 6,350,393 B2 | 2/2002 | Francis et al. | |
| 6,375,545 B1 | 4/2002 | Yano et al. | |
| 6,924,227 B2 | 8/2005 | Minamihaba et al. | |
| 7,186,654 B2 | 3/2007 | Matsui | |
| 2002/0023389 A1 | 2/2002 | Minamihaba et al. | |

(Continued)

FOREIGN PATENT DOCUMENTS

JP    11511394 T    10/1999

(Continued)

OTHER PUBLICATIONS

English Translation of the International Preliminary Report on Patentability dated Dec. 21, 2007, for International Application No. PCT/JP2006/300036 (4 pp.).

(Continued)

*Primary Examiner* — Nadine G Norton
*Assistant Examiner* — Maki Angadi
(74) *Attorney, Agent, or Firm* — Lowe, Hauptman, Ham & Berner, LLP

(57) ABSTRACT

An object of one embodiment of the present invention is to provide a polishing slurry which can reduce dishing and erosion of a to-be-polished semiconductor wafer. The polishing slurry contains an oxidizing agent and two or more kinds of abrasive grains for polishing, i.e., fumed silica and colloidal silica. A ratio (selectivity ratio) between a polishing rate of a metal film such as a tungsten film and a polishing rate of an insulating film (oxide film) such as a $SiO_2$ film can be adjusted by changing a mixing ratio between fumed silica and colloidal silica, and dishing and erosion of the semiconductor wafer can be thus reduced.

7 Claims, 15 Drawing Sheets

U.S. PATENT DOCUMENTS

| | | |
|---|---|---|
| 2004/0115944 A1 | 6/2004 | Matsui |
| 2005/0090104 A1* | 4/2005 | Yang et al. .................... 438/689 |
| 2006/0076317 A1* | 4/2006 | De Rege Thesauro et al. . 216/88 |

FOREIGN PATENT DOCUMENTS

| | | |
|---|---|---|
| JP | 2000204353 A | 7/2000 |
| JP | 2000-345144 | 12/2000 |
| JP | 2002-141314 | 5/2002 |
| JP | 2003-514061 | 4/2003 |
| JP | 2003-193038 | 7/2003 |
| JP | 2004-193495 | 7/2004 |

OTHER PUBLICATIONS

Notice of Reasons for Refusal for JP 2006-550892 dated Aug. 30, 2011.

* cited by examiner

POLISHING SLURRY

TECHNICAL FIELD

The present invention relates to a polishing slurry for use in CMP (chemical mechanical polishing).

BACKGROUND ART

Today, the CMP is becoming an indispensable technique for planarization of an interlayer dielectric film, formation of a plug inside a via hole, formation of an embedded metal wiring, and so forth (refer to Japanese Unexamined Patent Publication JP-A 2004-193495, for example).

Formation of an embedded metal wiring involving a CMP process will be described with reference to FIG. 14.

As shown in FIG. 14A, a concave groove for forming a wiring is formed in a dielectric film 10 such as an oxide film formed on a semiconductor substrate, and a barrier metal film 11 made of titanium nitride (TiN), etc. is then deposited over an entire surface of the dielectric film 10, thereafter depositing on the barrier metal film 11 a metal film 12 for forming a wiring made of tungsten (W), etc. over the entire surface so as to fill the groove.

Next, as shown in FIG. 14B, the CMP is applied to the metal film 12 for forming a wiring so that the metal film 12 for forming a wiring in an unnecessary region and the barrier metal film 11 lying thereunder are polished to be thereby removed, thus leaving the metal film 12 for forming a wiring only inside the groove. The metal wiring is thus formed.

In adopting such CMP to form the metal wiring however, the polishing is conducted using, as a polishing slurry, a slurry which is high in a polishing speed (polishing rate) for the metal film for forming a wiring, for example, a slurry containing fumed silica as abrasive grains for polishing, in order to shorten a length of polishing time to enhance the throughput, thus causing so-called dishing that a central part of the wide embedded wiring 12 is polished in a region where the groove is wide, and so-called erosion that the narrow embedded wiring 12 and the dielectric film 10 therearound are simultaneously polished in a region where the grooves densely exist, as shown in FIG. 15.

An uneven surface formed by such dishing and erosion easily causes a difference in level of a dielectric film in an upper layer of a multilayered wiring, thus posing a problem such as electrical short circuit due to a metal film for forming a wiring which remains after the polishing, when the wiring film on the upper layer is formed.

DISCLOSURE OF INVENTION

The invention has been completed in consideration of the above-stated problems in the related art, and an object of the invention is to provide a polishing slurry capable of reducing dishing and erosion.

The invention has the following constitution in order to achieve the above-stated object.

That is to say, a polishing slurry of the invention is a polishing slurry for use in the chemical mechanical polishing, which contains an oxidizing agent and two or more kinds of abrasive grains for polishing, the oxidizing agent being potassium iodate.

It is preferable that the abrasive grains are silica abrasive grains, and as the above-mentioned two or more kinds of abrasive grains for polishing, fumed silica and colloidal silica are contained.

Now, it is preferable that fumed silica is formed of secondary particles while colloidal silica is formed of primary particles.

According to the above constitution, the oxidizing agent is contained while two or more kinds of the abrasive grains for polishing, such as fumed silica and colloidal silica are contained, with the result that a ratio of polishing rate (selectivity ratio) can be selected with respect to a metal film and a dielectric film (oxide film) by selecting a mixing ratio between fumed silica which is high in the polishing rate on the metal film and colloidal silica which is high in the polishing rate on the dielectric film (oxide film), thereby allowing reduction of dishing and erosion as compared to the conventional examples.

In a preferred embodiment, the polishing slurry contains an acid, and has a pH of 1 to 6. It is more preferable that the polishing slurry has a pH of 2 to 4.

According to the embodiment, polishing ability of colloidal silica on the dielectric film can be sufficiently exhibited.

In another embodiment, a mixing ratio of the colloidal silica to a total amount of both kinds of the silica, i.e., the fumed silica and the colloidal silica falls in a range of 1% to 99%. The mixing ratio preferably falls in a range of 10% to 90%, and more preferably 20% to 70%. Further, a lower limit of the mixing ratio may be 50% or more.

According to the embodiment, the polishing rate ratio (selectivity ratio) can be selected based on the mixing ratio of the colloidal silica to fumed silica, thus allowing control of the polishing rate to the metal film and the dielectric film.

In still another embodiment, the polishing slurry is used for polishing a substrate on which a dielectric film and a metal film are formed.

According to the embodiment, the polishing slurry is used for polishing the substrate on which the dielectric film and the metal film are formed, thereby allowing reduction of dishing and erosion as compared to the conventional examples.

BRIEF DESCRIPTION OF DRAWINGS

Objects, features, and advantages of the invention will be more explicit from the following detailed description taken with reference to the drawing wherein.

BEST MODE FOR CARRYING OUT THE INVENTION

Figure 1:
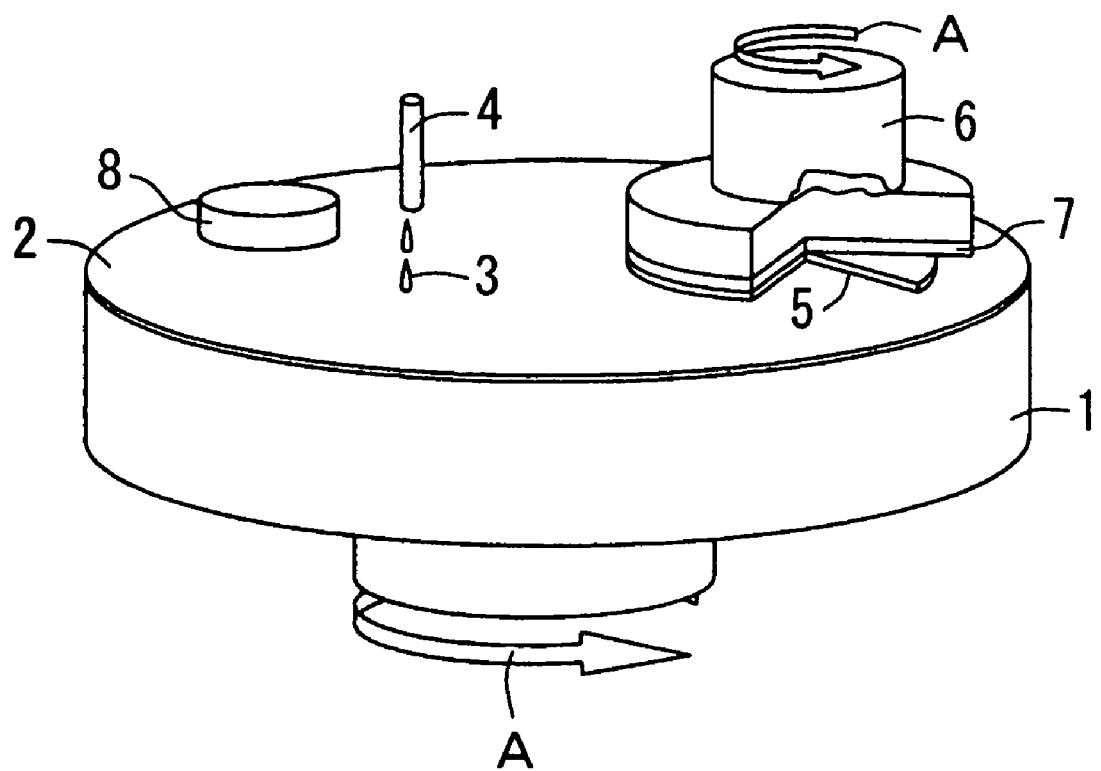
FIG. 1 is a schematic block diagram of a CMP apparatus for conducting a chemical mechanical polishing method according to one embodiment of the invention.

Now referring to the drawings, preferred embodiments of the invention will be described below.

The embodiments of the invention will be hereinafter described in detail with reference to the drawings.

FIG. 1 is a schematic block diagram of a CMP apparatus using a polishing slurry according to an embodiment of the invention.

To a polishing pad 2 attached to a surface of a platen 1 is continuously supplied a polishing slurry 3 according to the invention from a nozzle 4 for supplying a slurry. A semiconductor wafer 5 which is an object to be polished, is held by a polishing head 6 via a backing film 7. By applying a load to the polishing head 6, the semiconductor wafer 5 is pressed on the polishing pad 2.

The polishing slurry 3 supplied onto the polishing pad 2 is spread out on the polishing pad 2 and thus reaches the semiconductor wafer 5. The platen 1 and the polishing head 6 rotate in the same direction as shown by an arrow A, thus moving relatively so that the polishing slurry 3 is led between the polishing pad 2 and the semiconductor wafer 5 to thereby perform the polishing. Note that a numeral 8 indicates a dresser for sharpening a surface of the polishing pad 2.

Figure 2A:
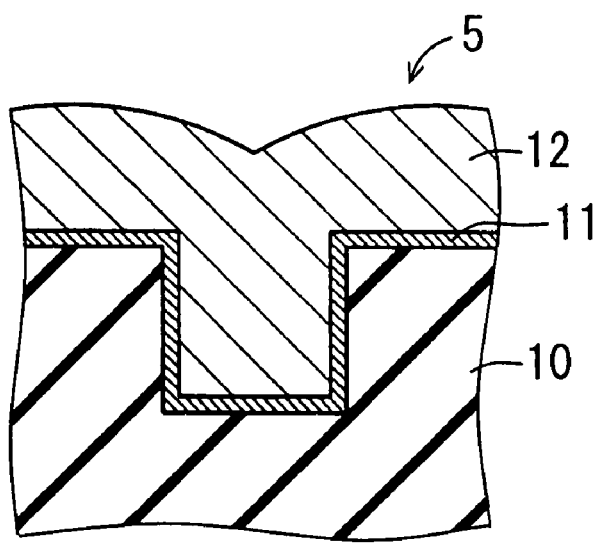
FIG. 2 is a partially-enlarged sectional view of a semiconductor wafer shown in FIG. 1.
Figure 2B:
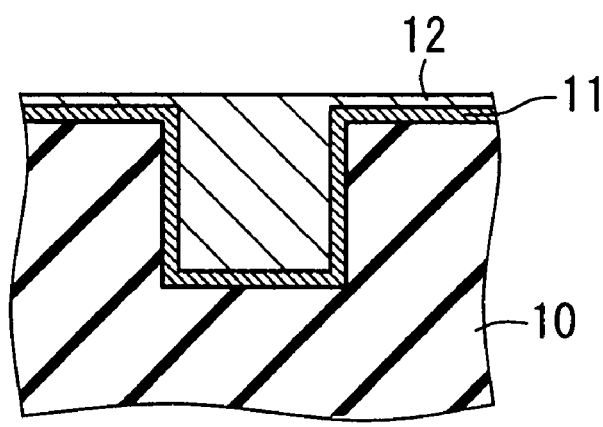
Figure 2C:
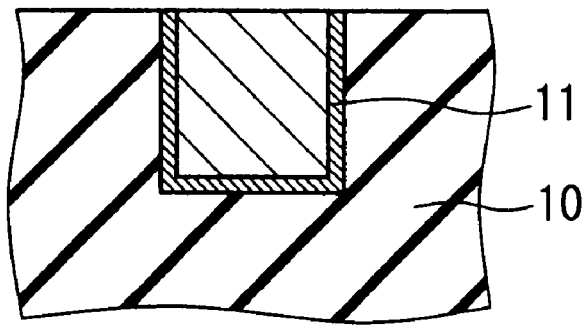

FIG. 2A is a partial sectional view showing one example of the semiconductor wafer 5 which is an object to be polished. In the semiconductor wafer 5, a dielectric film 10, i.e., an oxide film, made of silicon dioxide $SiO_2$ is formed on a wafer substrate, and on the dielectric film 10 in which a groove (or a via hole) is optionally formed, is deposited a barrier metal film 11 made of titanium Ti and titanium nitride TiN. And then on the barrier metal film 11 is deposited a wiring metal film 12 made of tungsten W which is a metal for forming a wiring, so as to fill the groove.

The semiconductor wafer 5 formed as described above is attached to the polishing head 6 shown in FIG. 1 so that the wiring metal film 12 is directed downward. The polishing is then performed.

Now, the polishing slurry for use in the present embodiment will be described in detail.

The polishing slurry according to the embodiment is a slurry of water-based medium which contains an oxidizing agent and two or more kinds of abrasive grains, i.e., fumed silica and colloidal silica.

The oxidizing agent can include: peroxide compounds such as hydrogen peroxide and ammonium perchlorate; and iodate compounds such as iodic acid, potassium iodate, and sodium iodate. A content of the oxidizing agent preferably falls in a range of 0.1% by weight to 7% by weight, and more preferably 0.5% by weight to 4% by weight, relative to the polishing slurry.

The polishing slurry preferably contains acid for adjusting its pH. The acid is not limited to particular acid, and heretofore known inorganic acid and organic acid can be used.

Among such acids, from the perspective of further enhancing the polishing ability of the polishing slurry, preferable are inorganic acids such as hydrochloric acid, nitric acid, sulfuric acid, fluoric acid, and carbonic acid and organic acids such as acetic acid, citric acid, malonic acid, and adipic acid, and particularly preferable is hydrochloric acid. One of the inorganic acid and organic acid may be used each alone, and two or more of the inorganic acid and organic acid may be used in combination. Further, one or two or more of the inorganic aid and one or two or more of the organic acid may be used in combination.

The polishing slurry exhibits a pH of preferably 1 to 6, more preferably 2 to 4, and particularly preferably 2 to 3. When the pH falls in an acid range of 1 to 6, the maximum polishing ability of colloidal silica is exhibited. The pH range can be easily attained by appropriately changing the acid content.

A content of the abrasive grains for polishing which includes both of fumed silica and colloidal silica, preferably falls in a range of 1% by weight to 50% by weight, more preferably 1% by weight to 40% by weight, and further preferably 2% by weight to 15% by weight, relative to the polishing slurry.

Further, a mixing ratio (weight ratio) of the colloidal silica to a total amount of both kinds of silica, i.e., fumed silica and colloidal silica preferably falls in a range of 1% to 99%, more preferably 10% to 90%, and furthermore preferably 20% to 70%. Further, a lower limit of the mixing ratio may be 50% or more.

Except for silica, the other abrasive grains for polishing such as alumina, ceria, and titania may be added as abrasive grains for polishing.

Further, in order to prevent the abrasive grains for polishing from being agglomerated, a buffer material such as potassium phosphate may be added.

The polishing slurry may contain one or two or more of various additives which have been customarily used for the polishing slurry in the CMP process conventionally, to an extent that preferable properties of the polishing slurry are not impaired. Specific examples of the additives include dispersant such as polycarboxylic ammonium; water-soluble alcohol such as ethanol, propanol, isopropanol, ethylene glycol, and glycerin; surfactant; viscosity regulator; and iron nitrate.

The polishing slurry contains the oxidizing agent and fumed silica as abrasive grains for polishing, therefore exhibiting a high polishing rate on the metal film made of tungsten, copper, etc. while the polishing slurry contains colloidal silica as abrasive grains for polishing, therefore exhibiting a high polishing rate on the dielectric film (oxide film) such as a $SiO_2$ film. By selecting the mixing ratio between fumed silica and colloidal silica, the ratio of polishing rate (selectivity ratio) can be, for example, substantially one, thereby allowing decreases in the dishing and erosion that are caused by excessively polishing the metal film for wiring a metal as compared to the dielectric film.

EXAMPLES

An impact on polishing properties given by the mixing ratio between fumed silica and colloidal silica was examined in the following manner.

Examination Example 1

There will be hereinbelow shown an examination example where hydrogen peroxide is used as the oxidizing agent.

Specifically, there were prepared polishing slurries in which a fumed silica aqueous solution having 5% by weight of solid content and a colloidal silica aqueous solution having 5% by weight of solid content are mixed with each other, respectively, at a ratio of 3:1, 2:1, 1:1, and 1:2. There were also prepared polishing slurries in which only fumed silica was used and only colloidal silica was used respectively as abrasive grains for polishing without mixing the above-described aqueous solutions. Respective polishing tests were then conducted on a wafer in whose surface a tungsten W film and a silicon oxide $SiO_2$ film had been formed.

Note that the respective polishing slurries contained 4% by weight of hydrogen peroxide as the oxidizing agent and 1% of 1 (mol/L)-hydrochloric acid and each have a pH set at 2.

Polishing conditions were set as follows: a load was set at 300 g/cm$^2$, a platen-rotating speed 50 rpm, a polishing head (carrier)-rotating speed 50 rpm, and a flow rate of polishing slurry 300 ml/min.

Further, the polishing rate of the tungsten film was determined in a manner that measurements were conducted at plural points by using a resistivity mapping system (RS35c manufactured by Tencor Co., Ltd.), and based on an average value of the obtained data, a film thickness of the tungsten film was calculated and a change of the film thickness was used. The polishing rate of the $SiO_2$ film was determined in a manner that measurements were conducted at plural points by using an optical film thickness measurement system (Nano spec/AFT5100 manufactured by Nanometrics Inc.), and based on an average value of the obtained data, a film thickness of the $SiO_2$ film was calculated and a change of the film thickness was used. The measurement results were shown in FIG. 3. Note that in FIG. 3, a horizontal axis represents a mixing ratio (%) of colloidal silica to the entire silica abrasive grains of fumed silica and colloidal silica while a left vertical axis represents a polishing rate (nm/min) and a right vertical axis represents a selectivity ratio (the polishing rate of W/the polishing rate of $SiO_2$).

Figure 3:
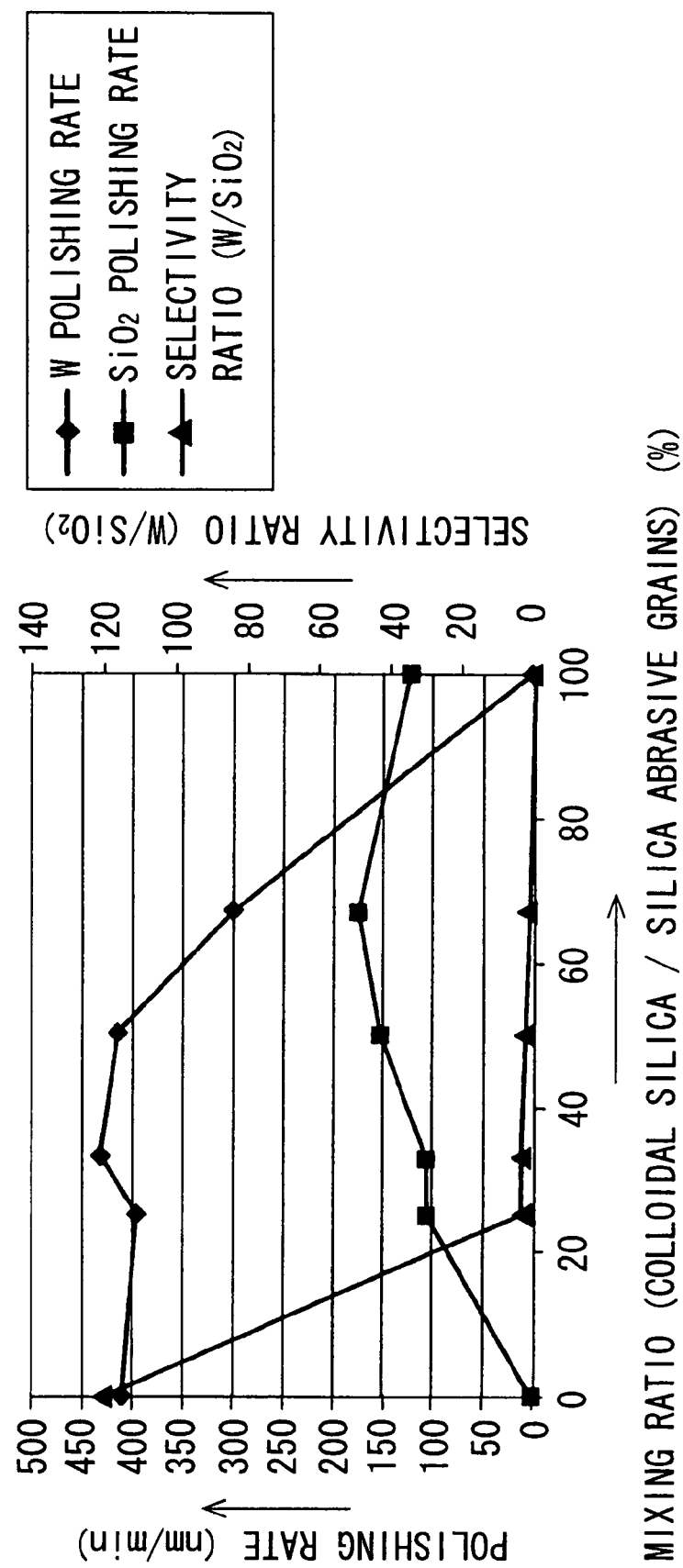
FIG. 3 is a view showing polishing properties of polishing slurry according to an embodiment of the invention.

As shown in FIG. 3, when fumed silica and colloidal silica are prepared at 3:1, that is, when the mixing ratio of colloidal silica to the entire silica abrasive grains is set at 25%, the selectivity ratio is 4, and when fumed silica and colloidal silica are prepared at 1:2, that is, when the mixing ratio is set at 66.7%, the selectivity ratio is 2. As just stated, the electivity ratio can change from 4 to 2 by changing the mixing ratio of colloidal silica to the entire silica abrasive grains from 25% to 66.7%.

Further, Table 1 illustrated below shows the measurement results of erosion in the case of performing the polishing with the polishing slurry containing fumed silica alone and in the case of performing the polishing with the polishing slurry in which fumed silica and colloidal silica are mixed at 1:2, that is, the mixing ratio of colloidal silica to the entire silica abrasive grains is set at 67%.

TABLE 1

| Fumed silica:Colloidal silica | 1:0 | 1:2 |
|---|---|---|
| Colloidal silica/silica abrasive grains (%) | 0 | 67 |
| Erosion (nm) | 60 | 30 |

As shown in Table 1, the erosion over 50 nm can be reduced to 30 nm or less.

Figure 4:
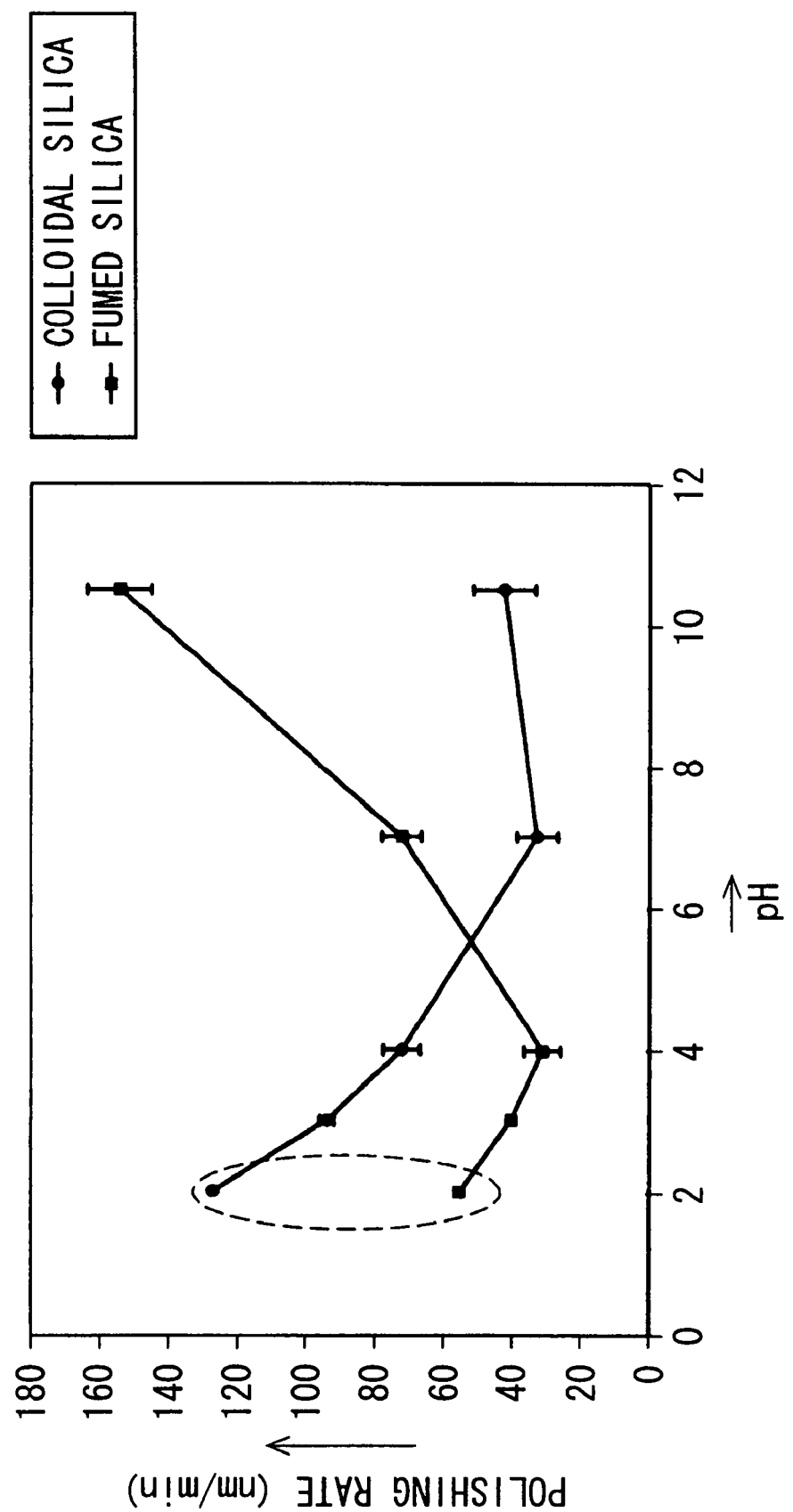
FIG. 4 is a view showing a relation between a pH and a polishing rate.

As shown in FIG. 4, colloidal silica is higher in the polishing rate on the $SiO_2$ film serving as a dielectric film, in the acid range, particularly around pH=2, than fumed silica is. Accordingly, the $SiO_2$ film was polished by about 30 nm to thereby reduce a 50 nm or more erosion difference caused by excessive abrasion of the metal film such as the tungsten film.

Note that FIG. 4 shows the polishing rate of fumed silica and colloidal silica on the $SiO_2$ film in relation to pH.

As described above, when using the polishing slurry according to the embodiment, the selectivity ratio between the polishing rate on the metal film made of tungsten, etc. and the polishing rate on the dielectric film (oxide film) can be controlled, therefore allowing decreases in the dishing and erosion which are caused by abrading the metal film too much compared to the dielectric film. This makes it possible to effectively prevent the electrical short circuit due to the metal film for forming a wiring which remains after the polishing, from arising when the wiring film on the upper layer is formed, thus resulting in a high-quality semiconductor device.

Further, the use of the silica abrasive grains allows smooth polishing without scratches which are generated in the case of using the alumina abrasive grains.

Examination Example 2

There will be hereinbelow shown an examination example where potassium iodate is used as the oxidizing agent.
(Polishing Slurry)

Polishing slurry for used in the present examination example was prepared as follows.

Fumed silica and water were mixed with each other to thereby fabricate highly-dispersed fumed silica dispersion having 20% by weight of solid content while colloidal silica and water were mixed with each other to thereby fabricate highly-dispersed colloidal silica dispersion having 20% by weight of solid content. And then, the fumed silica dispersion and the colloidal silica dispersion were mixed with each other, respectively, at a ratio of 9:1, 8:2, 7:3, 6:4, 5:5, and 1:3, thereby fabricating abrasive grain dispersion in which the mixing ratio of colloidal silica to silica abrasive grains (hereinafter referred to as simply "mixing ratio") was 10%, 20%, 30%, 40%, 50%, and 75%. Note that the fumed silica dispersion is abrasive grain dispersion whose mixing ratio is 0% and the colloidal silica dispersion is abrasive grain dispersion whose mixing ratio is 100%.

Potassium iodate acting as the oxidizing agent was dissolved in water, thereby fabricating an oxidizing agent solution whose potassium iodate concentration was 4% by weight. Further, pH of the oxidizing agent solution was adjusted to 2 by adding hydrochloric acid to the oxidizing agent solution in fabricating the solution.

The abrasive grain dispersion having the mixing ratio of 10% and the oxidizing agent solution were mixed with each other at a ratio of 1:3, thereby fabricating the polishing slurry which contains 5% by weight of the silica abrasive grains and 3% by weight of the potassium iodate and exhibits a pH of 2.2 and the mixing ratio of 10%.

Further, the polishing slurries each having the mixing ratio of 20%, 30%, 40%, 50%, and 75% were fabricated in the same manner as that of the polishing slurry having the mixing ratio of 10% except that the abrasive grain dispersion having the mixing ratio of 20%, 30%, 40%, 50%, and 75% was used instead of the abrasive grain dispersion having the mixing ratio of 10%. The polishing slurry containing only fumed silica as the silica abrasive grains (fumed silica stand-alone slurry) was fabricated in the same manner as that of the polishing slurry having the mixing ratio of 10% except that the fumed silica dispersion was used instead of the abrasive grain dispersion having the mixing ratio of 10%. The polishing slurry containing only colloidal silica as the silica abrasive grains (colloidal silica stand-alone slurry) was fabricated in the same manner as that of the polishing slurry having the mixing ratio of 10% except that the colloidal silica dispersion was used instead of the abrasive grain dispersion having the mixing ratio of 10%.

Note that the above concentration is a concentration at the time of the polishing and therefore, as to the timing for mixing the abrasive grain dispersion and the oxidizing agent dispersion, they may have been mixed with each other in advance or may be mixed with each other just before the polishing.

(Polishing Evaluation)

The above-stated respective polishing slurries were examined in the following manner regarding the polishing evaluation (the evaluation on the polishing rate, the evaluation on the surface condition, and the evaluation on the uniformity). Using the above-stated respective polishing slurries, the polishing operations were conducted under the following polishing conditions on a wafer in whose surface had been formed metal films, i.e., a tungsten (W) film and a titanium (Ti) film, and an oxide film, i.e., a $SiO_2$ film.

The polishing conditions were a polishing apparatus (SH-24 manufactured by SpeedFAM Corporation), a polishing pad (IC1400 manufactured by Nitta Haas Incorporated), a polishing time of 60 seconds, a load of 5.0 psi (about 34450 Pa), a platen-rotating speed of 65 rpm, a polishing head (carrier)-rotating speed of 65 rpm, and a flow rate of polishing slurry of 125 ml/min. Objects to be polished are a wafer in which an 8 inch-$SiO_2$ film is formed and a wafer obtained by forming a W film and a Ti film on the above wafer.

Figure 5:
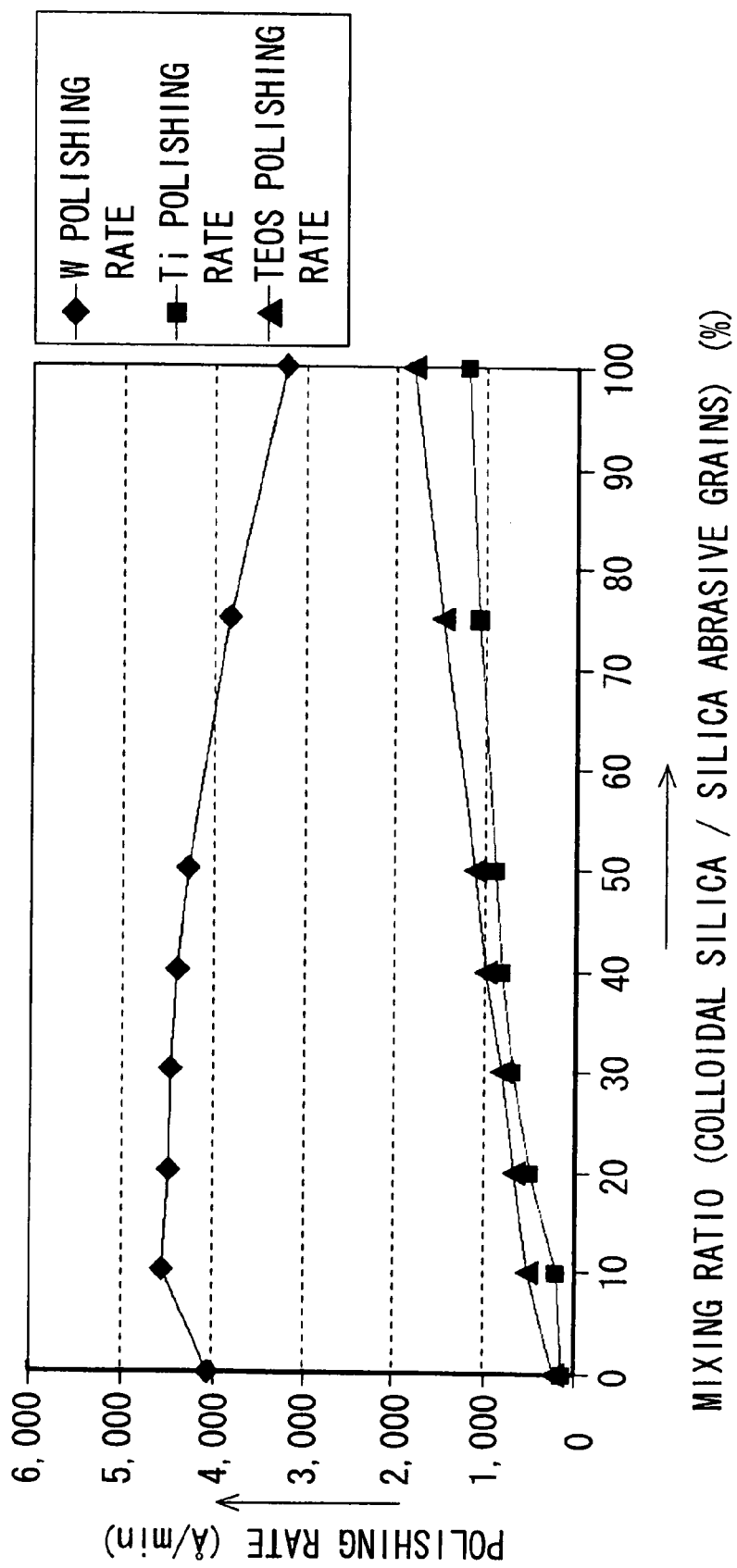
FIG. 5 is a view showing polishing rates obtained when respective polishing slurries of an examination example 2 are used.

FIG. 5 is a view showing the polishing rates obtained when respective polishing slurries of the examination example 2 are used. A horizontal axis of the graph represents the mixing ratio (%) while a vertical axis of the graph represents the polishing rate (Å/min). The polishing rate of the W film was determined in a manner that measurements were conducted at plural points by using the resistivity mapping system (RS35c manufactured by Tencor Co., Ltd.), and based on an average value of the obtained data, a film thickness of the W film was calculated and a change of the film thickness was used. The polishing rate of the Ti film was determined in a manner that measurements were conducted at plural points by using the resistivity mapping system (RS35c manufactured by Tencor Co., Ltd.), and based on an average value of the obtained data, a film thickness of the Ti film was calculated and a change of the film thickness was used. The polishing rate of the $SiO_2$ film was determined in a manner that measurements were conducted at plural points by using the optical film thickness measurement system (Nano spec/AFT5100 manufactured by Nanometrics Inc.), and based on an average value of the obtained data, a film thickness of the $SiO_2$ film was calculated and a change of the film thickness was used.

As can be seen from FIG. 5, the result was shown that the higher the mixing ratio was, the higher the polishing rate was on the oxide film, i.e., the $SiO_2$ film and the barrier metal film, i.e., the Ti film.

Further, when the polishing slurry having the mixing ratio of 10% is used, the polishing rate on the W film is slightly higher than that in the case of using the fumed silica stand-alone slurry. When the polishing slurry having the mixing ratio higher than 10% is used, the result was shown that the higher the mixing ratio was, the lower the polishing rate of the W film was.

Accordingly, the selectivity ratio, i.e., the ratio of the polishing rate of the W film to that of the $SiO_2$ film can be controlled by selecting the mixing ratio.

Figure 6:
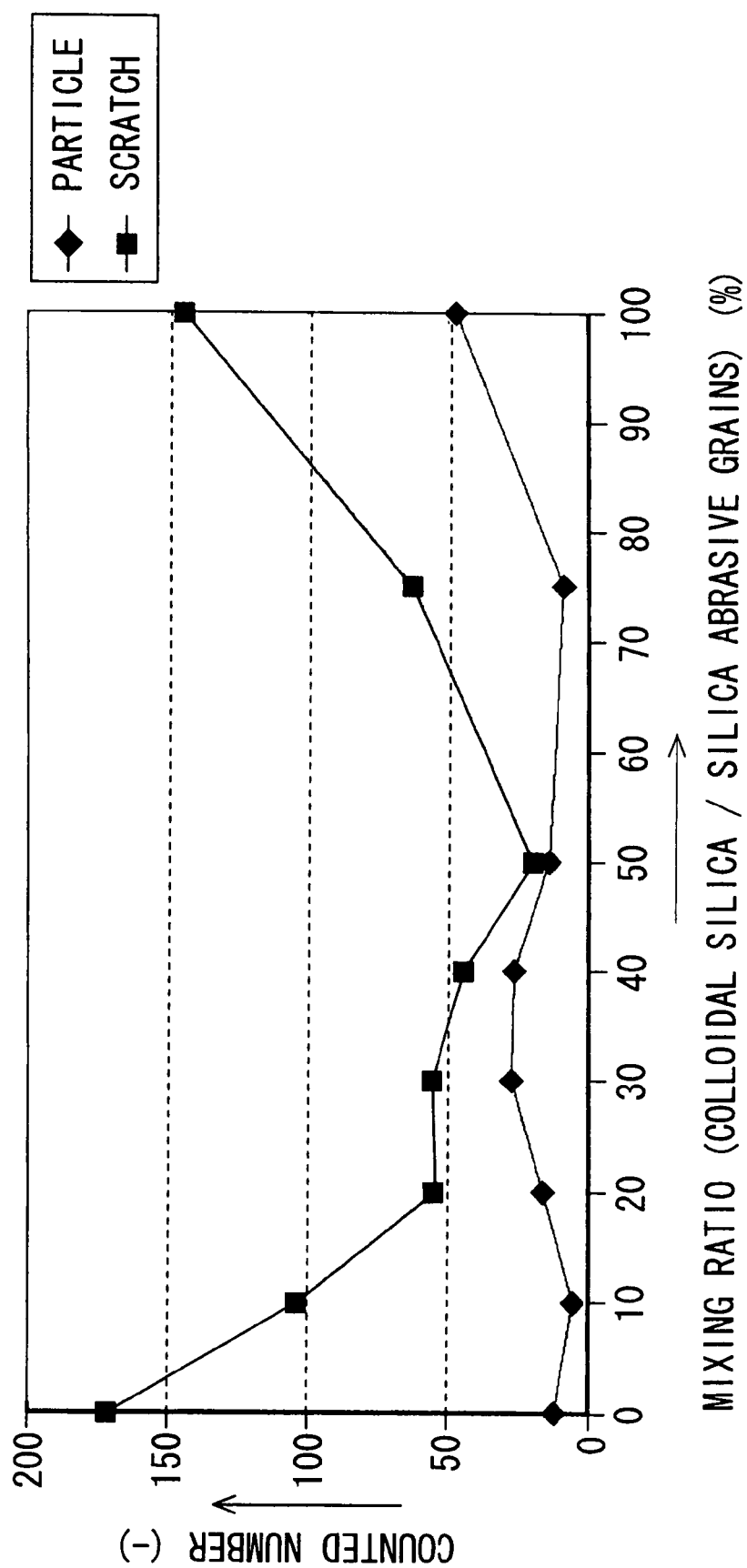
FIG. 6 is a view showing the number of counted defects which are generated in polishing a $SiO_2$ film with the respective polishing slurries of the examination example 2.

FIG. 6 is a view showing the number of counted defects which are generated in polishing a $SiO_2$ film with the respective polishing slurries of the examination example 2. A horizontal axis of the graph represents the mixing ratio (%) while a vertical axis of the graph represents the number of counted defects which are 0.2 μm or larger, per one sheet of the wafer. The defects were counted by using a wafer surface inspecting device (LS6600 manufactured by Hitachi High-Technologies Corporation).

As can be seen from FIG. 6, the result was shown that when the $SiO_2$ film was polished with the polishing slurry containing mixed fumed silica and colloidal silica, both of the number of the defects due to particles (polishing particles) and the number of the defects due to scratches (flaws) were small.

In the case where the $SiO_2$ film is polished by using the fumed silica stand-alone slurry, the result was shown that the polished $SiO_2$ film had a large number of the flaws and thus a large number of the defects due to the scratches. This reveals that the fumed silica stand-alone slurry only generates the flaws and is thus not very good for the polishing.

In the case where the $SiO_2$ film is polished by using the colloidal silica stand-alone slurry, the result was shown that the polished $SiO_2$ film had a large number of the flaws and polishing particles and thus a large number of the defects due to the scratches and the defects due to the particles. This is attributed to the fact that the colloidal silica stand-alone slurry has a zeta potential shifted to the positive side and therefore, the polishing particles are easily adsorbed to the surface of the $SiO_2$ film and thus remain thereon, generating the flaws due to the polishing particles.

Further, as seen from FIG. 6, the polishing slurry having the mixing ratio of 20% to 50% has a particularly small number of the defects due to the particles and the defects due to the scratches, thus being particularly preferable.

Figure 7:
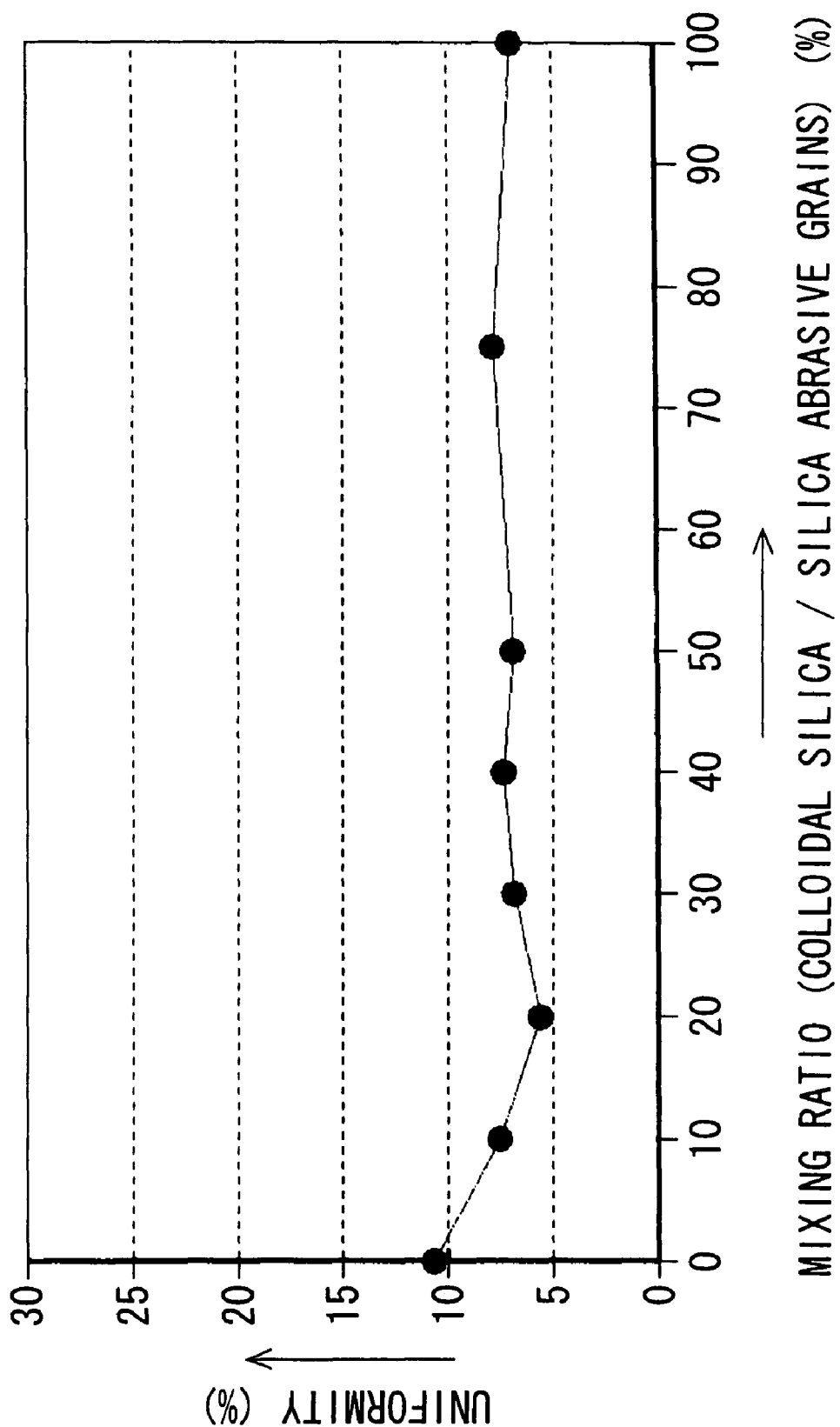
FIG. 7 is a view showing uniformity of a W film obtained when polished by using the respective polishing slurries of the examination example 2.

FIG. 7 is a view showing uniformity of the W film obtained when polished by using the respective polishing slurries of the examination example 2. A horizontal axis of the graph represents the mixing ratio (%) while a vertical axis of the graph represents the uniformity of the polished W film. The uniformity is determined in a manner that the film thickness of the polished silicon wafer is measured at plural positions, for example, 49 positions, and a difference between the maximum value and the minimum value relative to the average value of the thickness of the silicon wafer is indicated by percentage. The smaller the value is, the more excellent the uniformity of the thickness of the to-be-polished object is.

As can be seen from FIG. 7, the result was shown that when the W film was polished by using the polishing slurry containing mixed fumed silica and colloidal silica, the uniformity of the polished W film was high.

Further, FIG. 7 reveals that when the W film is polished by using the polishing slurry having the mixing ratio of 20%, the uniformity of the polished W film is the highest.

Next, the polishing rate was examined of the polishing slurry having the mixing ratio of 20% whose uniformity was the highest, as well as the fumed silica stand-alone slurry and the colloidal silica stand-alone slurry.

Figure 8:
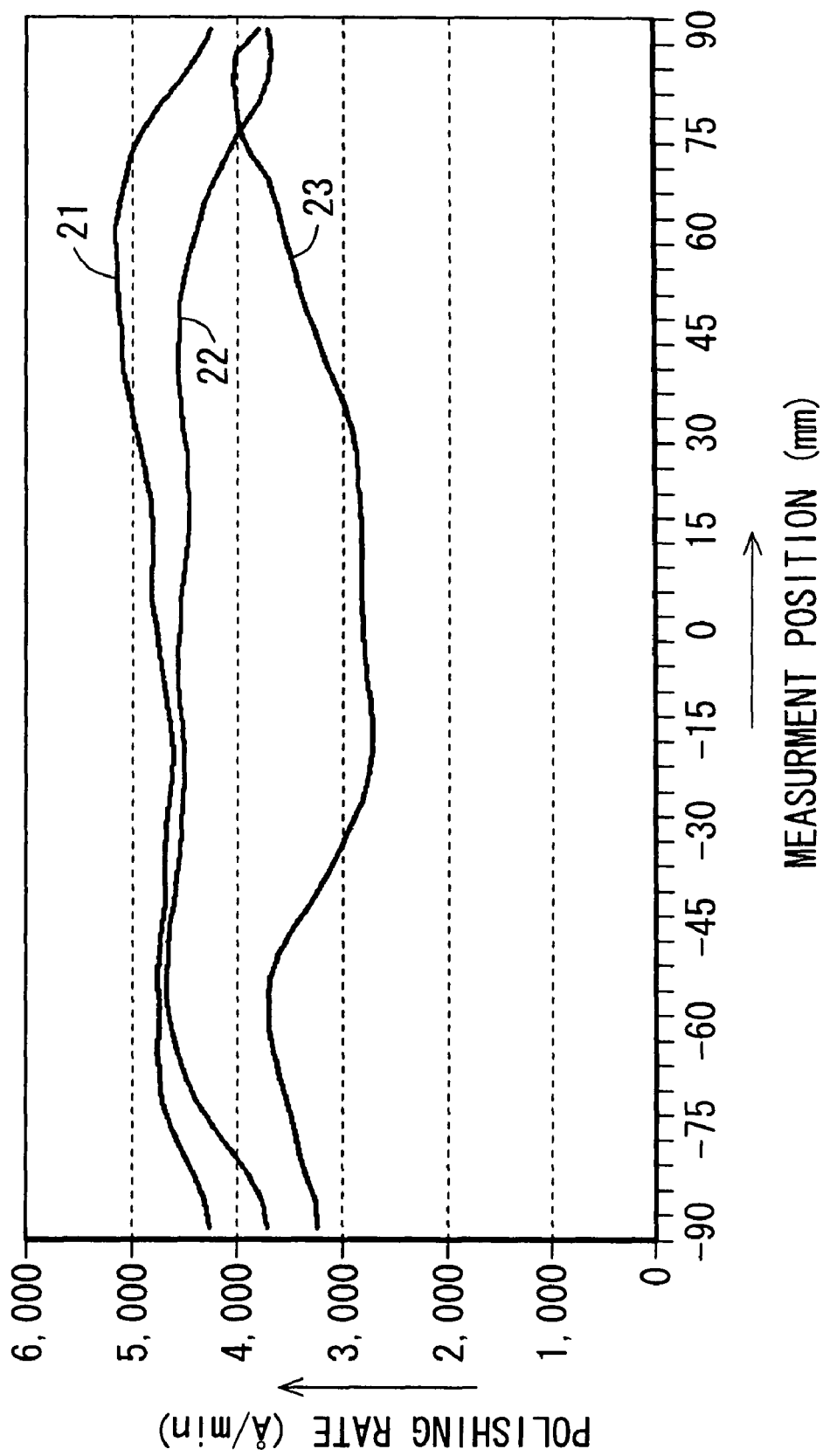
FIG. 8 is a view showing a relation between the polishing rate and a distance from a center of the wafer.

FIG. 8 is a view showing a relation (profile) between the polishing rate and a distance from a center of the wafer. A horizontal axis of the graph represents the distance (measurement position) (mm) from the center of the wafer while a vertical axis of the graph represents the polishing rate (Å/min). A smooth line 21 is a profile obtained in the case of using the polishing slurry having the mixing ratio of 20%. A smooth line 22 is a profile obtained in the case of using the fumed silica stand-alone slurry. A smooth line 23 is a profile obtained in the case of using the colloidal silica stand-alone slurry.

FIG. 8 reveals that in the case of using the polishing slurry of the mixing ratio of 20%, the polishing rate is substantially constant regardless of the measurement position. It is also found that in the case of using the fumed silica stand-alone slurry, the polishing rate is relatively high around the center of the wafer while the polishing rate is relatively low around the edges of the wafer. It is further found that in the case of using the colloidal silica stand-alone slurry, the polishing rate is relatively low around the center of the wafer while the polishing rate is relatively high around the edges of the wafer.

In view of the foregoing, it is found that in the case of using the polishing slurry having the mixing ratio of 20% in which fumed silica and colloidal silica are mixed with each other, the polishing rate is substantially constant regardless of the measurement position so that the uniformity of the polished wafer is high.

As described above, when the polishing slurry according to the embodiment is used, it is possible to control the selectivity ratio which is a ratio of the polishing rate of the W film to the polishing rate of the $SiO_2$ film. Further, the particles and scratches can be prevented from being left after the polishing, thereby resulting in a highly uniform wafer. It is therefore possible to reduce the dishing and erosion which are caused by abrading the metal film, i.e., the W film too much compared to the dielectric film, i.e., the $SiO_2$ film. This makes it possible to effectively prevent the electrical short circuit due to the metal film for forming a wiring which remains after the polishing, from arising when the wiring film on the upper layer is formed, thus resulting in a high-quality semiconductor device.

Next, the polishing slurry according to the embodiment (Example) and the metal-polishing slurry of the conventional design (Comparative example) were examined in comparison with each other.

Example

Example is the polishing slurry having the mixing ratio of 20% which was used in the examination example 2.

Comparative Example

Comparative example is the polishing slurry (SSW2000 manufactured by Cabot Corporation) which contains 4% by weight of hydrogen peroxide, 0.05% by weight of iron catalyst (ferric oxalate), and 5% by weight of fumed silica.

Example and Comparative example were examined in the following manner regarding the polishing evaluation (the evaluation on the polishing rate, the evaluation on the surface condition, the evaluation on the dishing, the evaluation on the erosion, and the evaluation on the recess). Using the above-stated respective polishing slurries, the polishing operations were conducted under the following polishing conditions on the wafer in whose surface had been formed the metal films, i.e., the tungsten (W) film and the titanium (Ti) film, and the oxide film, i.e., the $SiO_2$ film.

The polishing conditions were the polishing apparatus (SH-24 manufactured by SpeedFAM Corporation), the polishing pad (IC1400 manufactured by Nitta Haas Incorporated), a polishing time of 60 seconds, a load of 4.5 psi (about 31000 Pa), a platen-rotating speed of 65 rpm, a polishing head (carrier)-rotating speed of 65 rpm, and a flow rate of polishing slurry of 125 ml/min. The objects to be polished are the wafer in which the 8 inch-$SiO_2$ film is formed and the wafer obtained by forming the W film and the Ti film on the above wafer.

Figure 9:
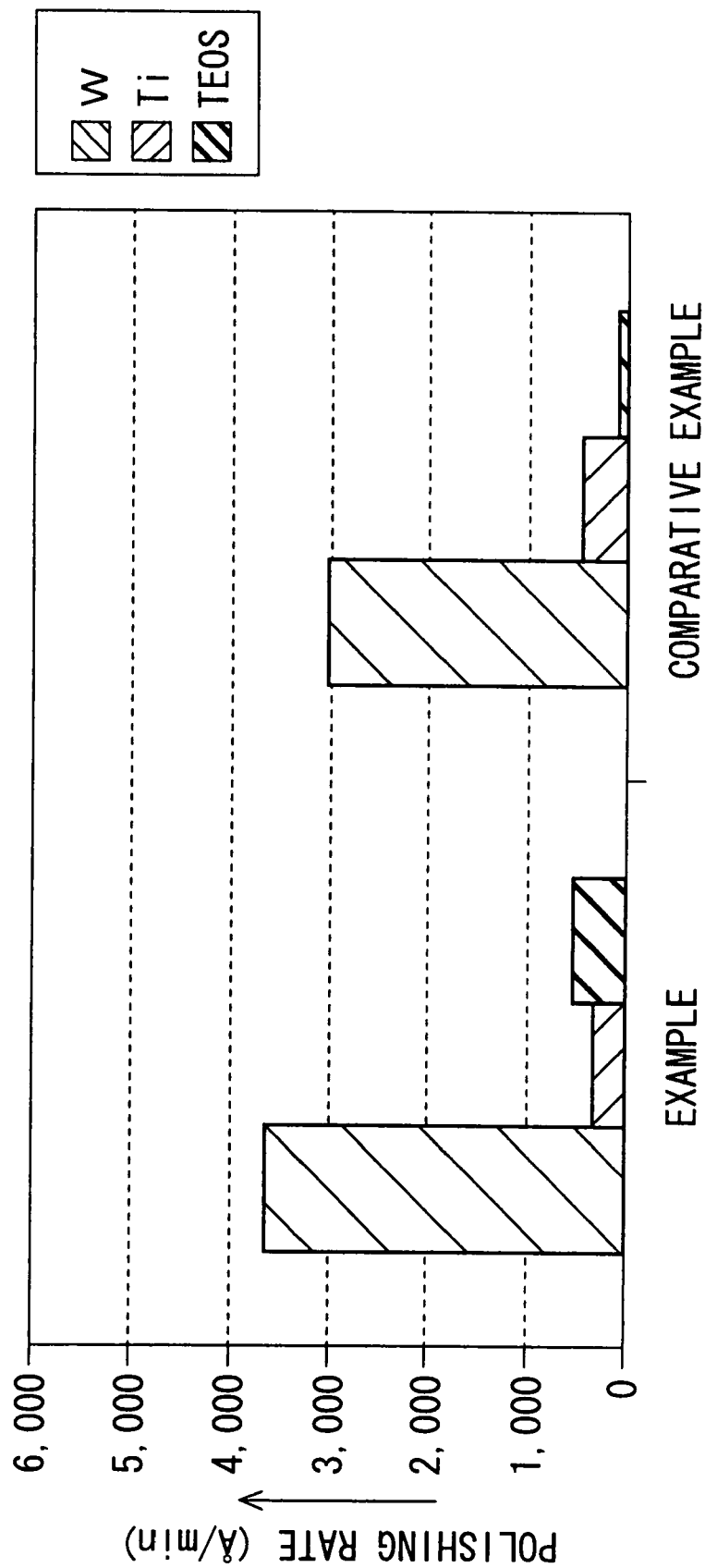
FIG. 9 is a view showing the polishing rate obtained when Example and Comparative example have been employed.

FIG. 9 is a view showing the polishing rate obtained when Example and Comparative example have been employed. A vertical axis of the graph represents the polishing rate (Å/min). The polishing rate were determined in a manner that measurement were conducted at plural points to obtain an average value thereof by using the resistivity mapping system (RS35c manufactured by Tencor Co., Ltd.) for the W film, the resistivity mapping system (RS35c manufactured by Tencor Co., Ltd.) for the Ti film, and the optical film thickness measurement system (Nano spec/AFT5100 manufactured by Nanometrics Inc.) for the $SiO_2$ film.

As can be seen from FIG. 9, it is found that the polishing rates of the W film and the $SiO_2$ film are higher in Example than those in Comparative example.

Example contains potassium iodate whose etching rate is low, but contains as the silica abrasive grains not only fumed silica but also colloidal silica which has excellent mechanical polishing force, with the result that the polishing rate of the W film and the polishing rate of the $SiO_2$ film are high, presumably.

Figure 10:
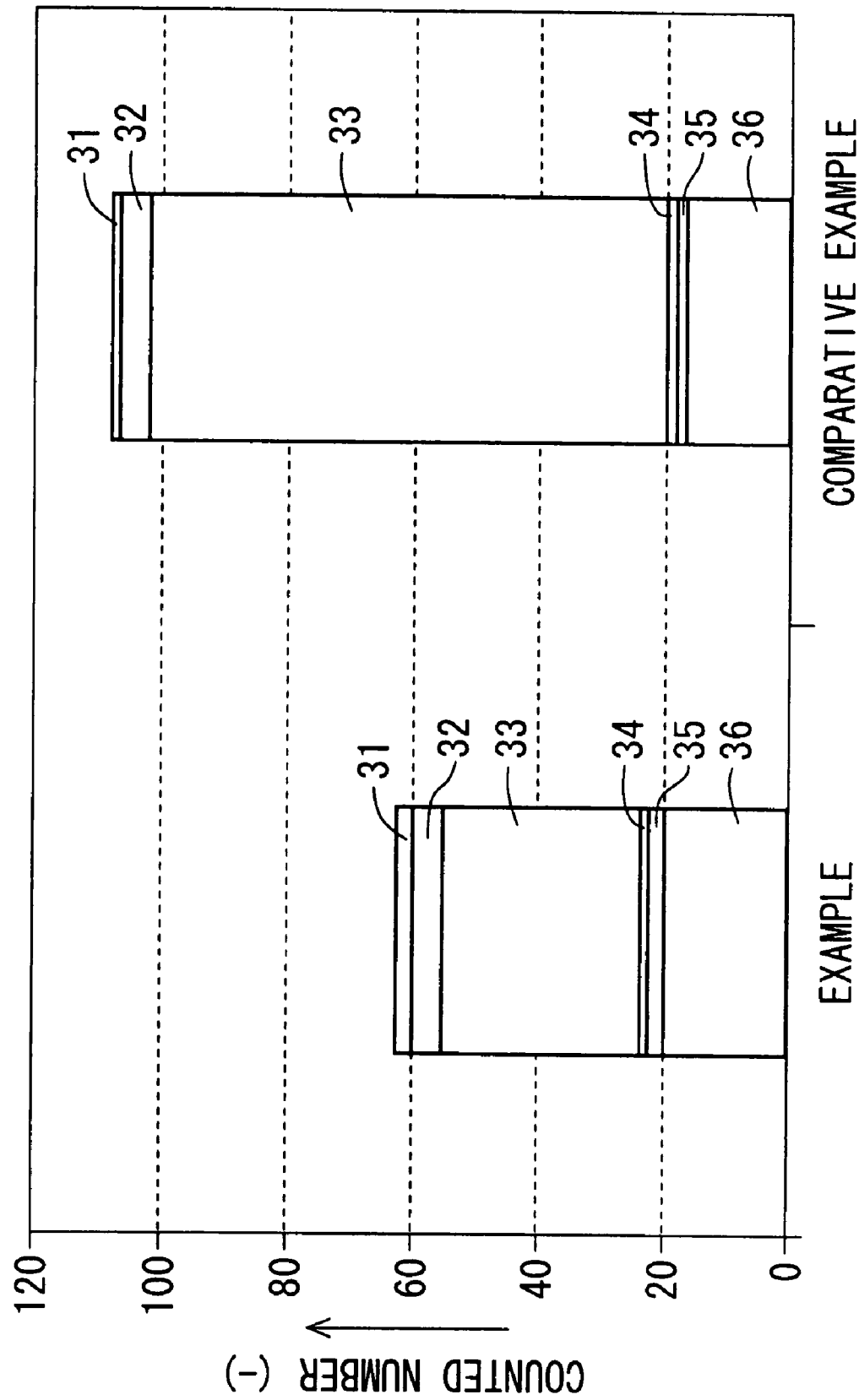
FIG. 10 is a view showing the number of defects counted when Example and Comparative example have been employed.

FIG. 10 is a view showing the number of defects counted when Example and Comparative example have been employed. A vertical axis of the graph represents the number of counted defects per one sheet of the wafer. A bar 31 represents the number of counted defects due to the particles which are larger than 0.50 μm, per one sheet of the wafer when the $SiO_2$ film was polished. A bar 32 represents the number of counted defects due to the particles which are larger than 0.35 μm and not larger than 0.50, per one sheet of the wafer when the $SiO_2$ film was polished. A bar 33 represents the number of counted defects due to the particles which are larger than 0.20 μm and not larger than 0.35, per one sheet of the wafer when the $SiO_2$ film was polished. A bar 34 represents the number of counted defects due to the scratches which are larger than 0.5 μm, per one sheet of the wafer when the $SiO_2$ film was polished. A bar 35 represents the number of counted defects due to the scratches which are larger than 0.35 μm and not larger than 0.50, per one sheet of the wafer when the $SiO_2$ film was polished. A bar 36 represents the number of counted defects due to the scratches which are larger than 0.20 μm and not larger than 0.35, per one sheet of the wafer when the $SiO_2$ film was polished. The defects were counted by using the wafer surface inspecting device (LS6600 manufactured by Hitachi High-Technologies Corporation).

As can be seen from FIG. 10, the result was shown that the number of the defects generated when the $SiO_2$ film had been polished was smaller in Example than that in Comparative example. Furthermore, in Example, the number of the defects which are larger than 0.20 μm and not larger than 0.35 is particularly small, revealing that there will be left the less number of tiny flaws and polishing particles. This indicates that Comparative example only generates the flaws and is thus not very useful for the polishing.

Figure 11:
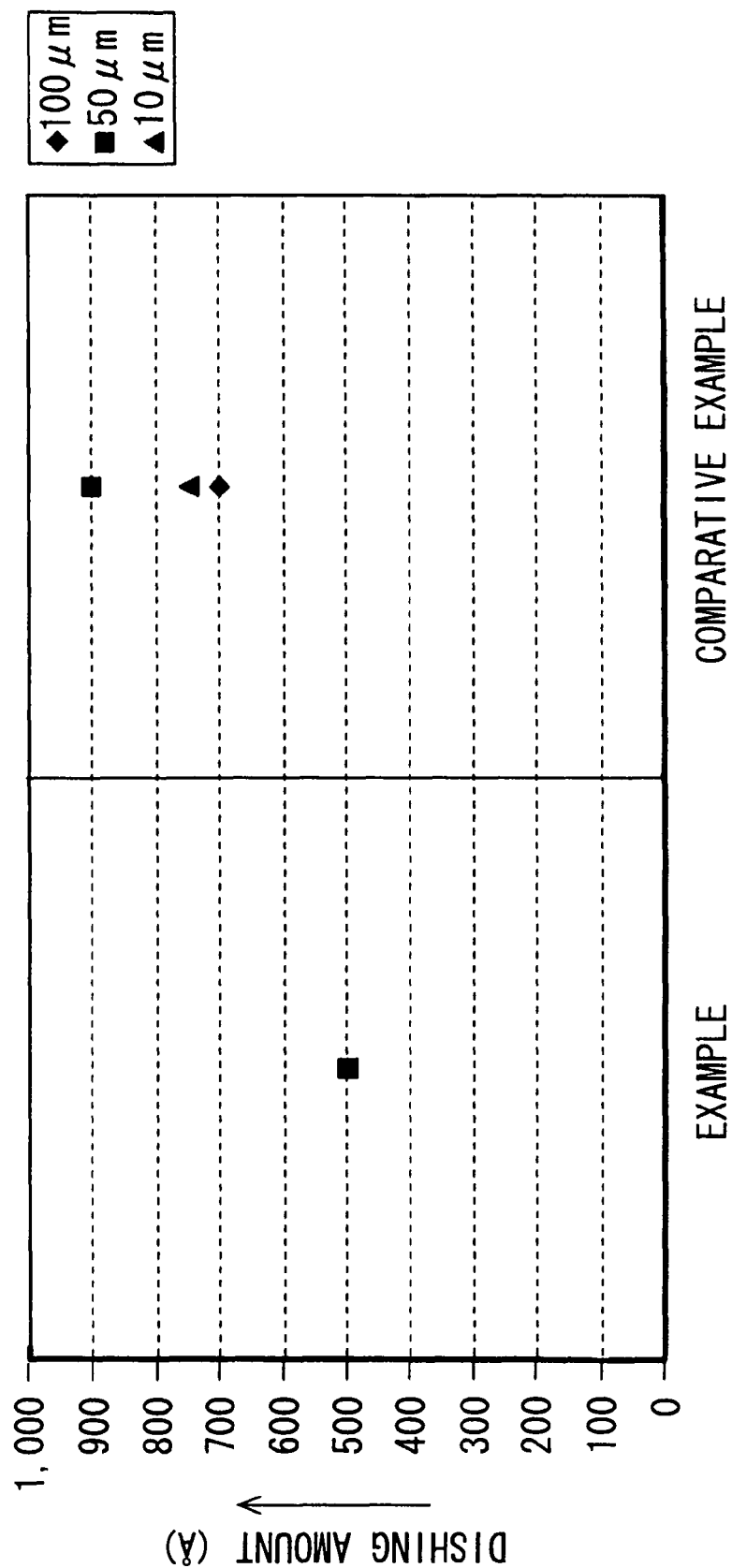
FIG. 11 is a view showing a dishing amount when Example and Comparative example have been employed.

FIG. 11 is a view showing a dishing amount when Example and Comparative example have been employed. A vertical axis of the graph represents the dishing amount (Å). The dishing amount is a dishing amount measured when the polishing was conducted on the substrates in which wirings formed of the W films each having a wiring width of 10 μm, 50 μm, and 100 μm were provided on the $SiO_2$ film. The dishing amount was measured by a stylus profilometer (P-12 manufactured by Tencor Co., Ltd.).

FIG. 11 shows that Example generates a less dishing amount than Comparative examples does, regardless of the wiring width of the wiring formed of the W films. This is attributed to the fact that the etching action of potassium iodate is weak.

Figure 12:
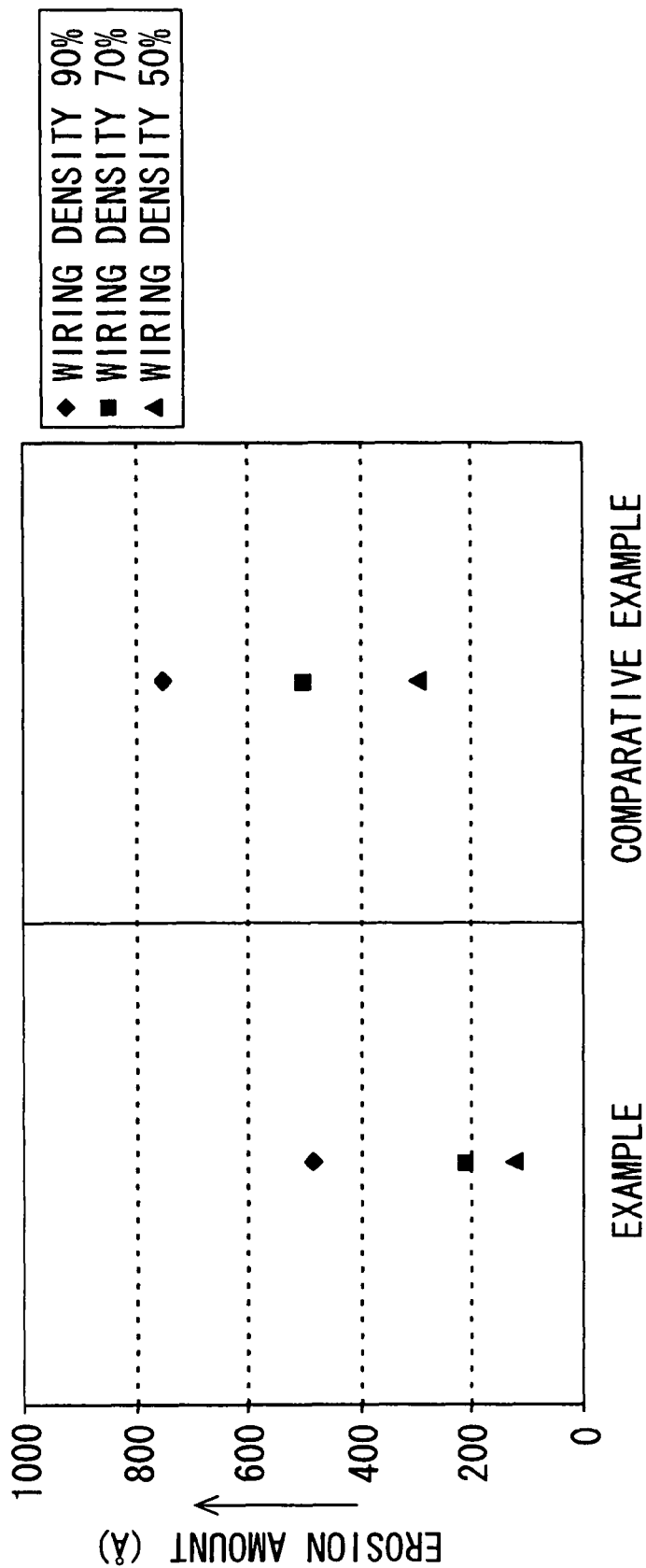
FIG. 12 is a view showing an erosion amount when Example and Comparative example have been employed.

FIG. 12 is a view showing an erosion amount when Example and Comparative example have been employed. A vertical axis of the graph represents the erosion amount (Å). The erosion amount is an erosion amount measured when the polishing was conducted on the substrates in which wirings formed of the W films each having a wiring density of 50%, 70%, and 90% were provided on the $SiO_2$ film. The erosion amount was measured by an atomic force microscopy (AFM-SPA465 manufactured by Seiko Instruments Inc.).

FIG. 12 shows that Example generates a less erosion amount than Comparative examples does, regardless of the wiring density of the wiring formed of the W films. This is attributed to the fact that the etching action of potassium iodate is weak.

Figure 13:
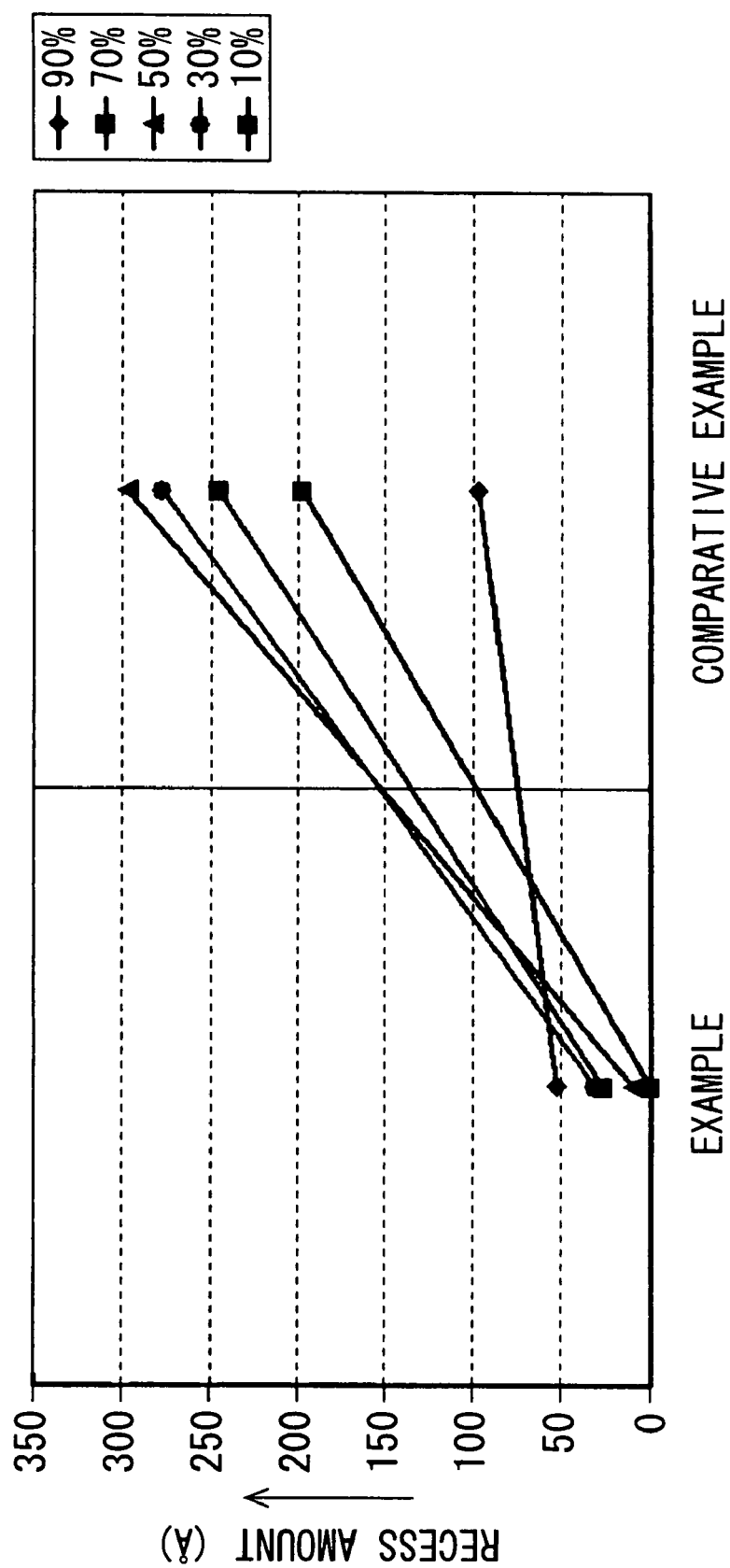
FIG. 13 is a view showing a recess amount when Example and Comparative example have been employed.
Figure 14A:
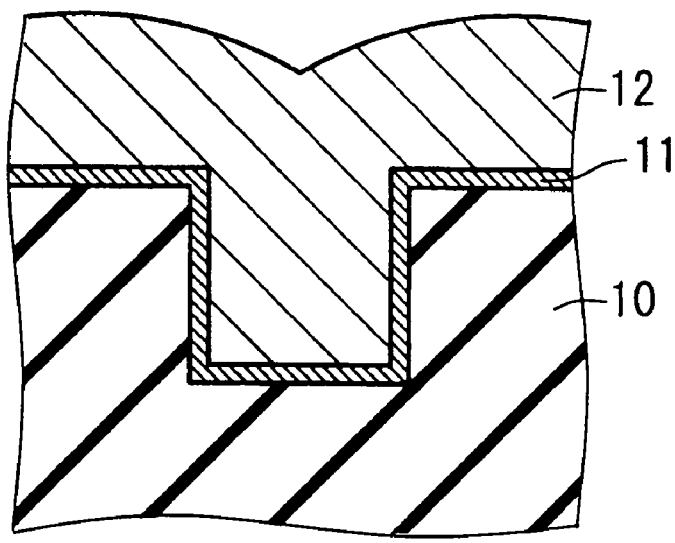
FIG. 14 is a partially-enlarged section view of the semiconductor wafer for explaining formation of an embedded metal wiring through the chemical mechanical polishing method.
Figure 14B:
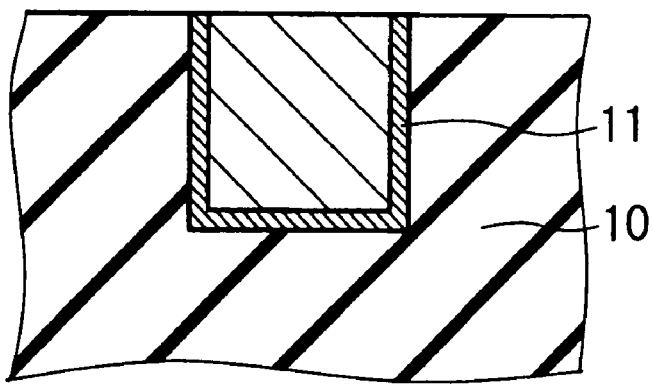
Figure 15:
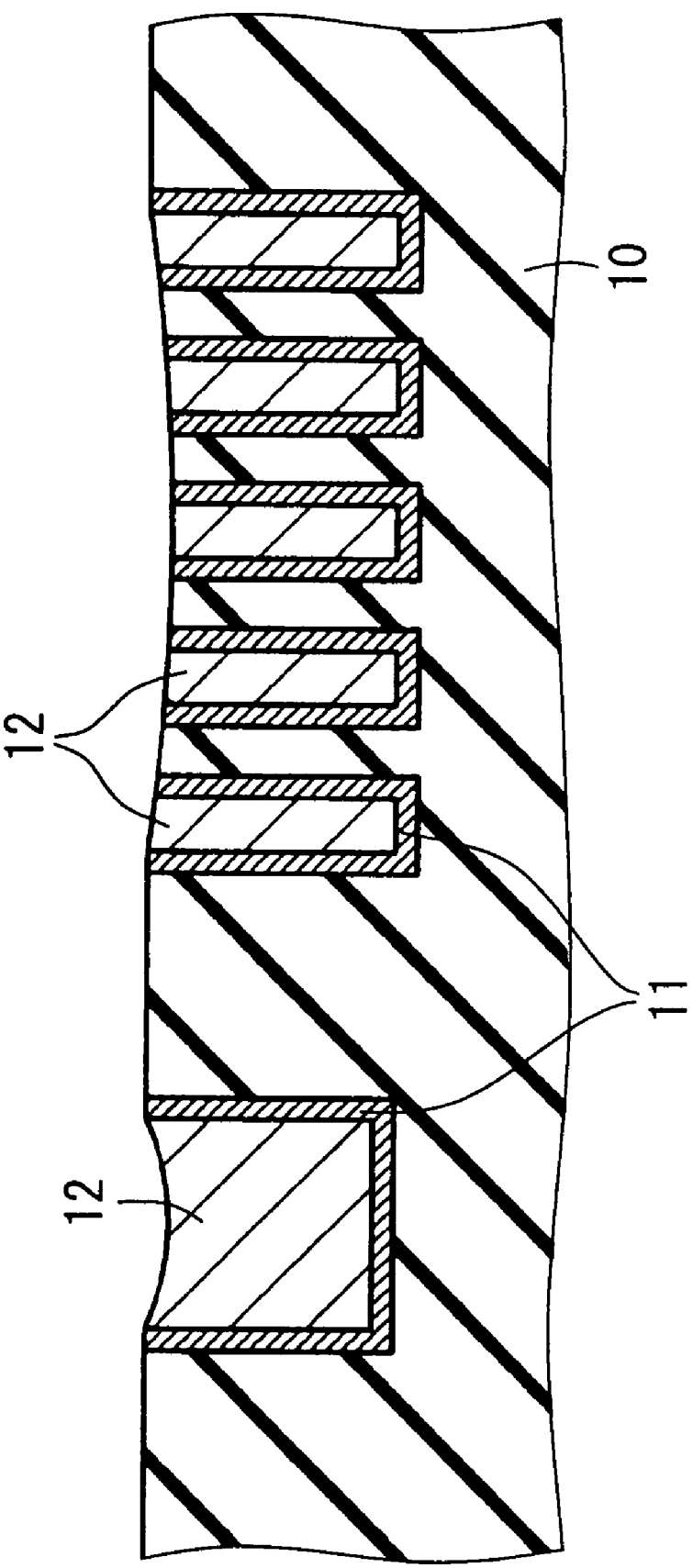
FIG. 15 is a view showing the dishing and the erosion.

FIG. 13 is a view showing a recess amount when Example and Comparative example have been employed. A vertical axis of the graph represents the recess amount (Å). The recess amount is a recess amount measured when the polishing was conducted on the substrates in which wirings formed of the W films each having a wiring density of 10%, 30%, 50%, 70%, and 90% were provided on the $SiO_2$ film. The recess amount was measured by the atomic force microscopy (AFM-SPA465 manufactured by Seiko Instruments Inc.).

FIG. 13 shows that Example generates a less erosion amount than Comparative examples does, regardless of the wiring density of the wiring formed of the W films. This is attributed to the fact that the etching action of potassium iodate is weak.

As described above, the polishing slurry containing the oxidizing agent and the silica abrasive grains can reduce the dishing, erosion, and recess where the silica abrasive grains contain colloidal silica and fumed silica.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to the invention, it is possible to select a ratio of polishing rate (selectivity ratio) in accordance with a metal film and a dielectric film (oxide film) based on a mixing ratio between two or more kinds of abrasive grains for polishing, namely fumed silica and colloidal silica, thereby allowing decreases in dishing and erosion as compared to the conventional examples.

The invention is useful for polishing a semiconductor wafer, an optical component lens, etc.

The invention claimed is:

1. A polishing slurry for use in chemical mechanical polishing, comprising an oxidizing agent and two or more kinds of abrasive grains, wherein the abrasive grains comprise fumed silica and colloidal silica, the oxidizing agent being potassium iodate, wherein a mixing ratio of colloidal silica to a total amount of silica of fumed silica and colloidal silica falls in a range of 10% to 99% by weight.

2. The polishing slurry of claim 1, comprising an acid and having a pH of 1 to 6.

3. The polishing slurry of claim 2, which is used for polishing a substrate having an insulating film and metal film formed thereon.

4. The polishing slurry of claim 1, which is used for polishing a substrate having an insulating film and metal film formed thereon.

5. The polishing slurry of claim 1, which is used for polishing a substrate having an insulating film and metal film formed thereon.

6. The polishing slurry of claim 1, which is used for polishing a substrate having an insulating film and metal film formed thereon.

7. The polishing slurry of claim 1, which is used for polishing a substrate having an insulating film and metal film formed thereon.

* * * * *